(12) United States Patent
Acar et al.

(10) Patent No.: US 8,151,230 B2
(45) Date of Patent: Apr. 3, 2012

(54) BLENDED MODEL INTERPOLATION

(75) Inventors: Emrah Acar, Montvale, NJ (US); Damir Jamsek, Austin, TX (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 12/420,879

(22) Filed: Apr. 9, 2009

(65) Prior Publication Data

US 2010/0262409 A1    Oct. 14, 2010

(51) Int. Cl.
G06F 17/50 (2006.01)

(52) U.S. Cl. .................. 716/111; 716/136; 703/14

(58) Field of Classification Search ............... 716/111, 716/136; 703/14
See application file for complete search history.

(56) References Cited

U.S. PATENT DOCUMENTS

| | | | |
|---|---|---|---|
| 5,389,953 A | 2/1995 | Agar et al. | |
| 5,467,291 A | 11/1995 | Fan et al. | |
| 6,721,922 B1 | 4/2004 | Walters et al. | |
| 6,813,598 B1 | 11/2004 | Tani | |
| 2004/0044509 A1 | 3/2004 | Demler et al. | |
| 2004/0181761 A1* | 9/2004 | Kidera .............................. | 716/2 |
| 2005/0043908 A1 | 2/2005 | Bhavnagarwala et al. | |
| 2005/0197816 A1 | 9/2005 | Inukai et al. | |
| 2009/0216571 A1* | 8/2009 | Sunshine et al. .................. | 705/5 |
| 2009/0259453 A1 | 10/2009 | Wason et al. | |
| 2010/0262412 A1 | 10/2010 | Acar et al. | |
| 2010/0262413 A1 | 10/2010 | Acar et al. | |

OTHER PUBLICATIONS

U.S. Appl. No. 12/420,891, 2 pages.
U.S. Appl. No. 12/420,910, 1 page.
Bourenkov, Victor et al., "MOS Table Models for Circuit Simulation", IEEE Transactions on Computer-Aided Design of Integrated Circuits and Systems, vol. 24, No. 3, Mar. 2005, pp. 352-362.
Notice of Allowance mailed Oct. 13, 2011 for U.S. Appl. No. 12/420,891, 6 pages.
Office Action mailed Oct. 13, 2011 for U.S. Appl. No. 12/420,910, 22 pages.
Ab-Rahman, A.A.H et al., "Analysis on the Effects of MOSFET Threshold Voltage Mismatch in CMOS Operational Amplifiers for RF Applications". International RF and Microwave Conference Proceedings, IEEE, Sep. 12-14, 2006, pp. 192-196.
Croon, J.A. et al., "A comparison of extraction techniques for threshold voltage mismatch", IEEE 2002 International Conference on Microelectronic Test Structures, Apr. 2002, vol. 15, pp. 235-240.

(Continued)

*Primary Examiner* — Vuthe Siek
*Assistant Examiner* — Aric Lin
(74) *Attorney, Agent, or Firm* — Francis Lammes; Stephen J. Walder, Jr.; Libby Z. Toub

(57) ABSTRACT

According to the illustrative embodiments, a data structure is accessed to determine a set of known data points surrounding a queried data point having an input value and an output value, the set of known data points including first, second and third data points. First and second curves are built from the first, second and third data points utilizing a first approximate model and a second approximate model. A weighting parameter value is determined by which the first curve and second curve are blended at the second data point. The output value of the queried data point is determined and stored by blending the first curve and the second curve utilizing the input value of the queried data point and the weighting parameter value.

15 Claims, 14 Drawing Sheets

OTHER PUBLICATIONS

Pineda De Gyvez, Jose et al., "Threshold Voltage Mismatch (Vt) Fault Modeling", 21st IEEE VLSI Test Symposium, 2003, 6 pages.

Pineda De Gyvez, Jose et al., "Threshold Voltage Mismatch and Intra-Die Leakage Current in Digital CMOS Circuits", IEEE Journal of Solid-State Circuits, Jan. 2004, vol. 39, No. 1, pp. 157-168.

* cited by examiner

Figure 4A
Figure 4B

BLENDED MODEL INTERPOLATION

CROSS-REFERENCE TO RELATED APPLICATIONS

The present application is related to the following co-pending applications, which are filed on even date herewith and incorporated herein by reference in their entireties:
U.S. patent application Ser. No. 12/420,891; and
U.S. patent application Ser. No. 12/420,910.

BACKGROUND OF THE INVENTION

1. Technical Field

The present invention relates in general to modeling the performance of integrated circuits.

2. Description of the Related Art

The integrated circuit (IC) industry relies on simulation to verify the functionality of and to predict the performance of ICs prior to fabrication. Conventional IC simulators, such as SPICE, contain models of the behavior of each of the individual devices that can be fabricated within an IC and permit users to specify interconnections between the individual devices within an IC design in order to model the overall functionality and performance of the modeled IC. Thus, in order to achieve predictive accuracy, conventional IC simulators must include accurate models for devices such as resistors, capacitors, inductors and transistors (e.g., Metal-Oxide-Semiconductor Field Effect Transistors (MOSFETs)).

Because transistors exhibit a complex non-linear behavior, transistor models are correspondingly complex, often having one hundred or more parameters. Consequently, an accurate transistor model takes a long time to characterize. For example, currently in industry, it is not uncommon for the development of a complete MOSFET model to require several months. To generate useful predictions, the model must additionally be validated or characterized over all values of temperature, voltage, device dimensions, and other fabrication variables. The time required to generate the complete MOSFET model and then validate it contributes significantly to the overall expense and length of the design cycle.

SUMMARY OF THE INVENTION

According to a method of data processing, a data structure is accessed to determine a set of known data points surrounding a queried data point having an input value and an output value, the set of known data points including first, second and third data points. First and second curves are built from the first, second and third data points utilizing a first approximate model and a second approximate model. A weighting parameter value is determined by which the first curve and second curve are blended at the second data point. The output value of the queried data point is determined and stored by blending the first curve and the second curve utilizing the input value of the queried data point and the weighting parameter value.

BRIEF DESCRIPTION OF THE DRAWINGS

FIG. 4A depicts an exemplary embodiment of a table for storing data of an intermediate data set generated utilizing an existing mathematical simulation model in accordance with one embodiment;

FIG. 4B illustrates an exemplary embodiment of a table of a time domain simulation model of a test transistor in accordance with one embodiment;

DETAILED DESCRIPTION OF ILLUSTRATIVE EMBODIMENT

Figure 1:
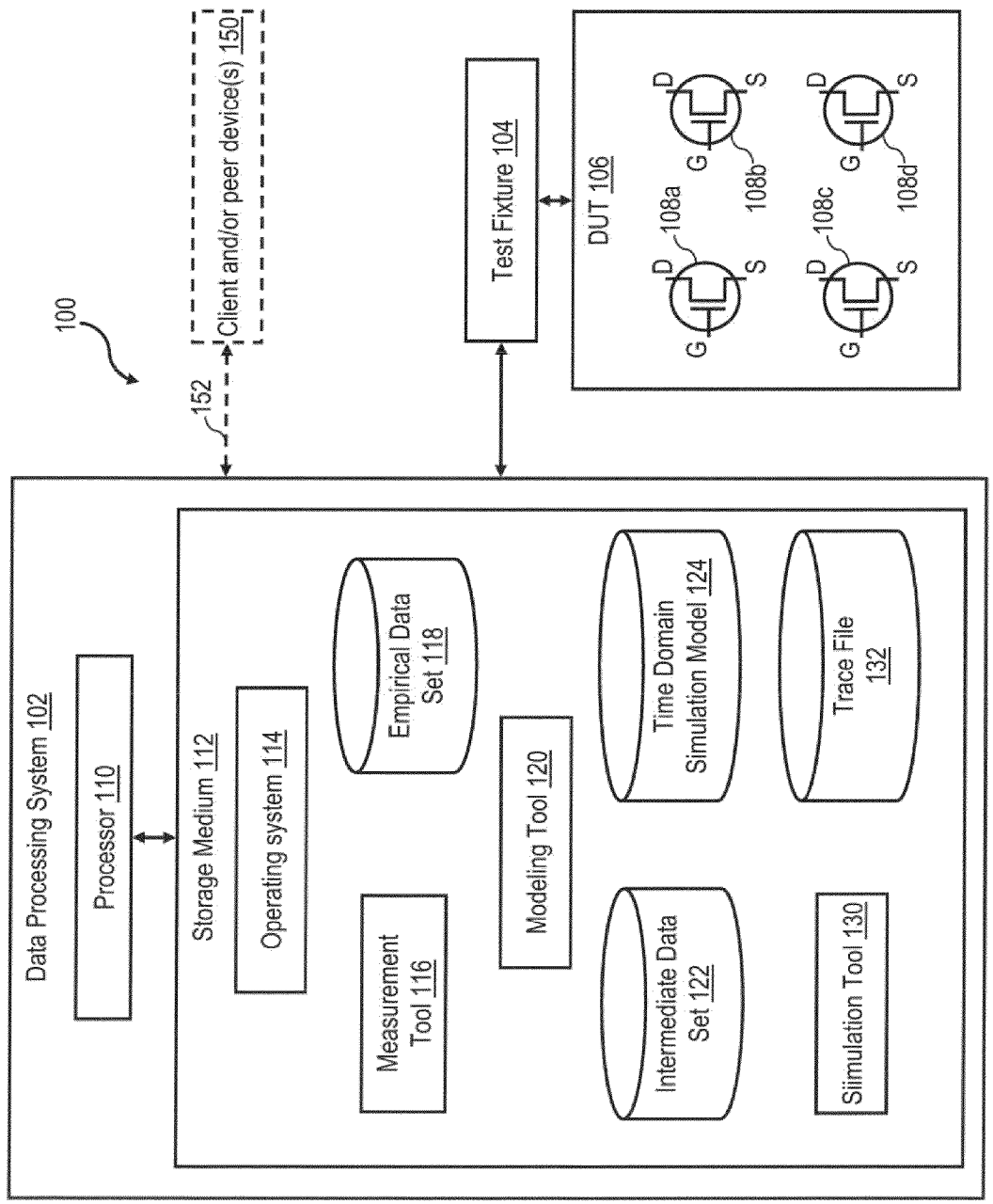
FIG. 1 is a high level block diagram of an exemplary environment in which an embodiment can be practiced.

With reference now to FIG. 1, there is illustrated a high level block diagram of an exemplary environment 100 for characterizing an integrated circuit (IC) and for generating a time domain simulation model of a device within the IC. As shown, environment 100 includes a data processing system 102 coupled to a test fixture 104 suitable for testing a physical device under test (DUT) 106, such as a microprocessor, memory chip, or other integrated circuit (IC). As will be appreciated, DUT 106 may contain thousands, millions or billions of transistors, as well as other devices, such as resistors, capacitors, inductors, diodes, etc. Among the devices fabricated within DUT 106 are test transistors (generally represented by MOSFETs 108*a*-108*d*) of differing geometries that are accessible to probes of test fixture 104. Embedding MOSFETs 108 within DUT 106 insure that the same manufacturing environment is utilized as the basis for generating the time domain simulation model as will be utilized to fabricate the commercial run of the integrated circuit. Further details regarding DUT 106 and the test transistors fabricated therein can be found, for example, in U.S. Pat. No. 7,408,372, which is incorporated herein by reference.

Data processing system 102 includes at least one storage medium 112 coupled to a processor 110 for processing program code and data. In various embodiments, storage medium 112 may comprise volatile and/or non-volatile memory, disk storage, a removable storage medium, or other computer-readable storage medium as is known in the art. Storage medium 112 stores program code processed by processor 110 to perform the operations described herein.

The program code within storage medium 112 includes an operating system 114 that manages the various resources of data processing system 102 including processor 110 and storage medium 112. The program code within storage medium 112 further includes a measurement tool 116, a modeling tool 120, and a simulation tool 130. Measurement tool 116 characterizes DUT 106 and its constituent devices by controlling stimulation of DUT 106 by test fixture 104 and gathering the resultant empirical test data. Measurement tool 116 stores the empirical test data obtained from the stimulation of DUT 106 within storage medium 112 as empirical data set 118.

Modeling tool 120 generates a time domain simulation model 124 of the behavior of at least one device (e.g., MOSFET 108) within DUT 106, as described in further detail below with reference to FIG. 2. In at least one embodiment, modeling tool 120 generates time domain simulation model 124 in part from empirical data set 118.

Simulation tool 130 simulates the operation of an integrated circuit design by reference to one or more time domain simulation models 124 generated by modeling tool 120. Simulation tool 130 stores the simulation results in a trace file 132. An exemplary method by which simulation tool 130 simulates operation of an integrated circuit is described in further detail below with reference to FIG. 6.

As further illustrated in FIG. 1, exemplary environment 100 may optionally further include one or more client and/or peer device(s) 150, which may, for example, be constructed similarly to data processing system 102. Client and/or peer devices 150 can be coupled to data processing system 102 for communication by a communication network 152, such as a local area network (LAN) or wide area network (WAN). Client or peer device(s) 150 can request services from data processing system 102, including execution of measurement tool 116, modeling tool 120 and/or simulation tool 130.

As will be appreciated, data processing system 102 can include many additional components that are not necessary for an understanding of the claimed invention and are accordingly not illustrated in FIG. 1 or discussed further herein.

Figures 2, 3:
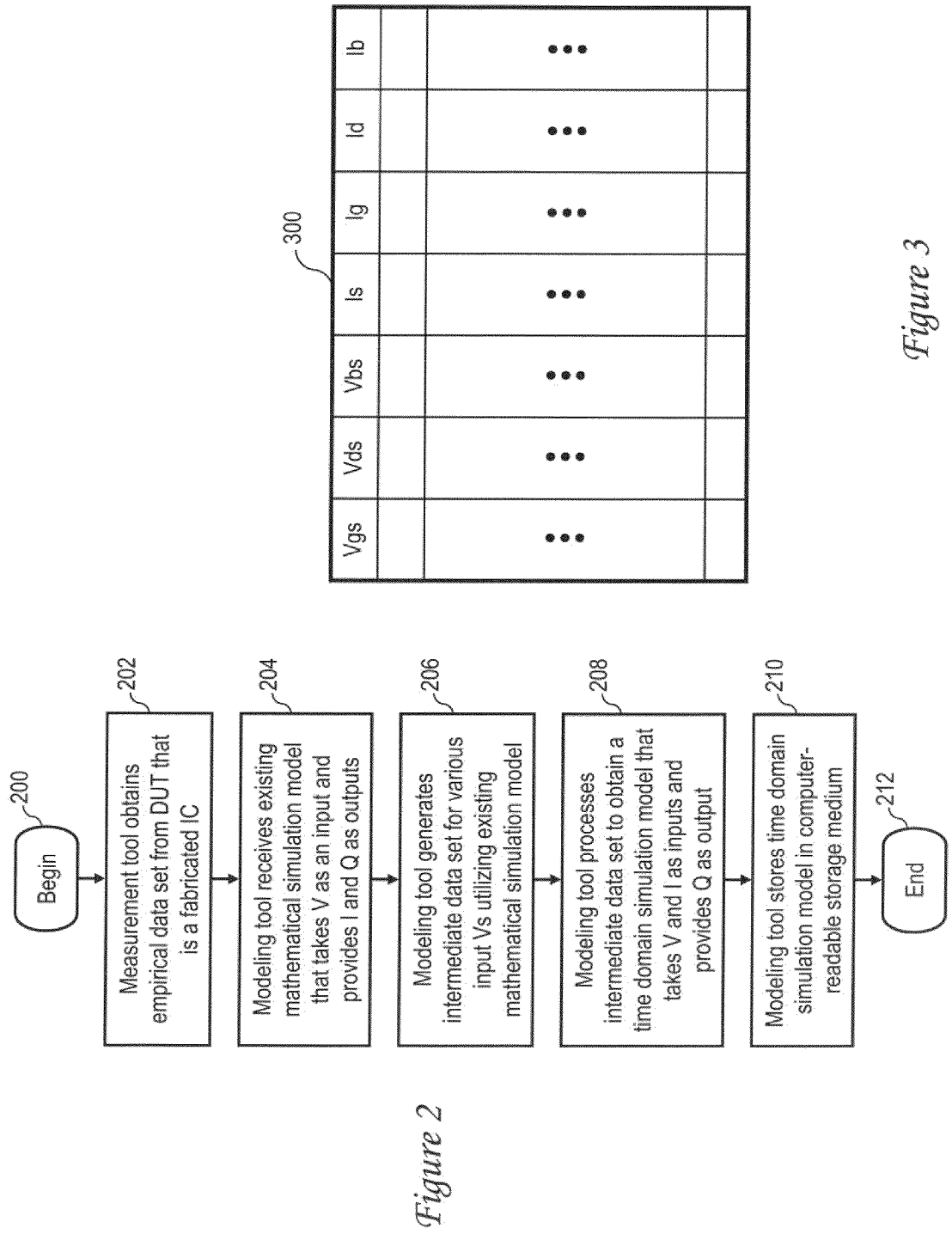
FIG. 2 is a high level logical flowchart of an exemplary method of generating a time domain simulation model in accordance with one embodiment.
FIG. 3 illustrates an exemplary embodiment of a table for storing empirical test data gathered from a test transistor in a device under test in accordance with one embodiment.
Figure 5B:
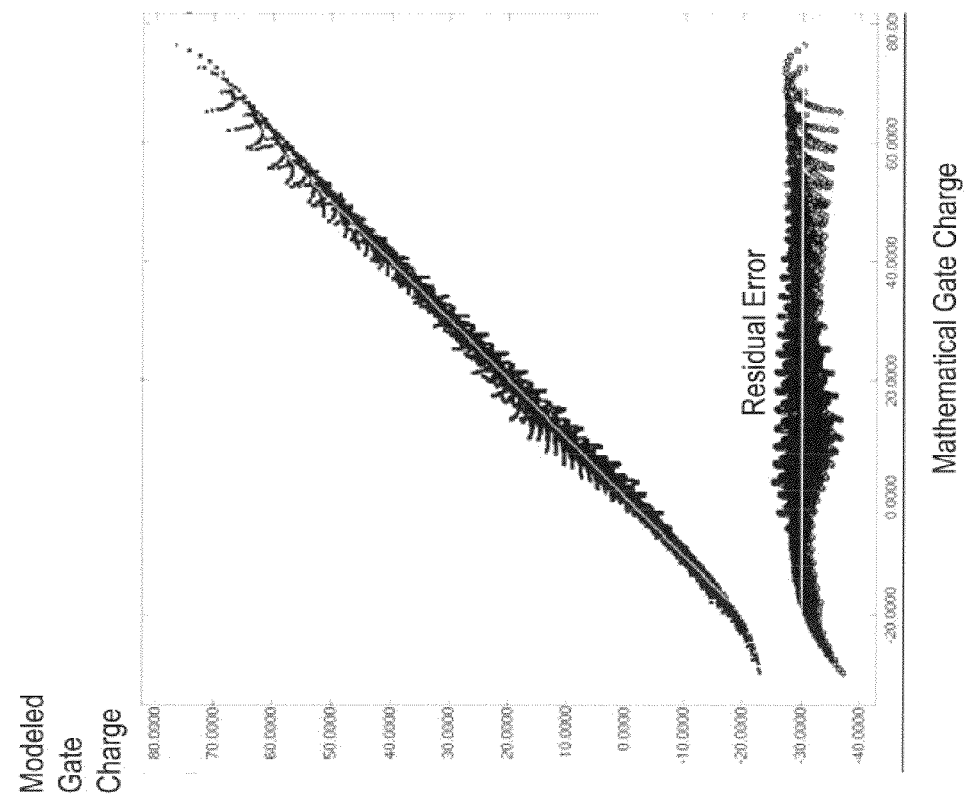
FIGS. 5A-5D are plots of the charge at the four terminals (e.g., source, gate, drain, and body) of a test transistor according to an empirically derived approximate simulation model versus a mathematical simulation model.
Figure 5A:
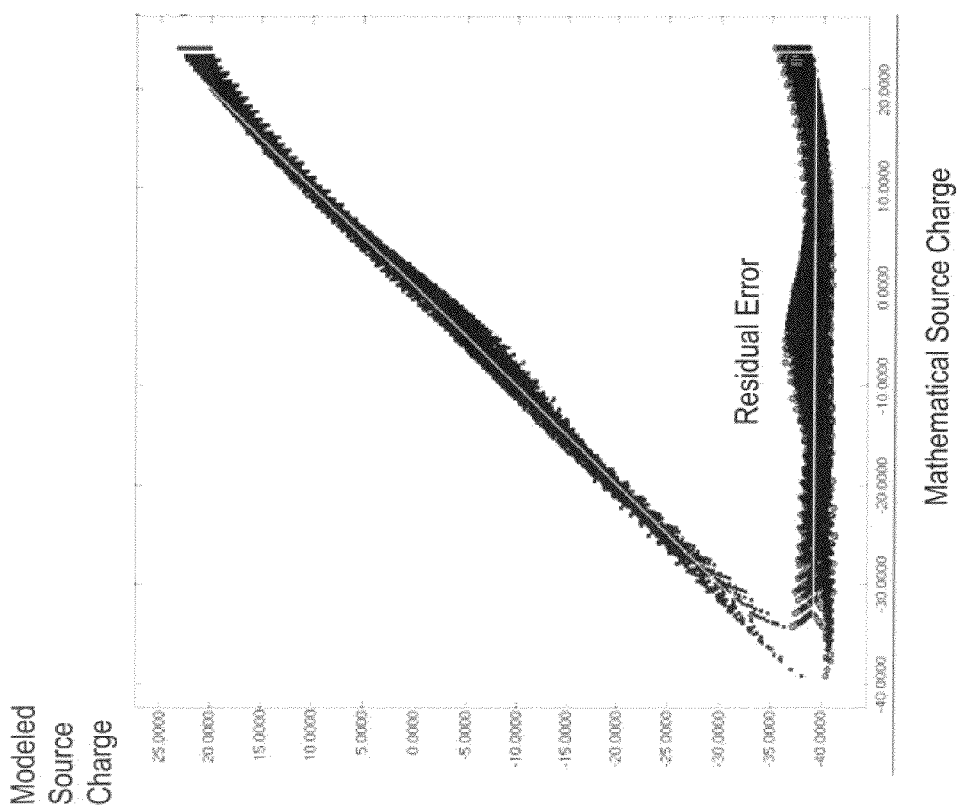
Figure 5D:
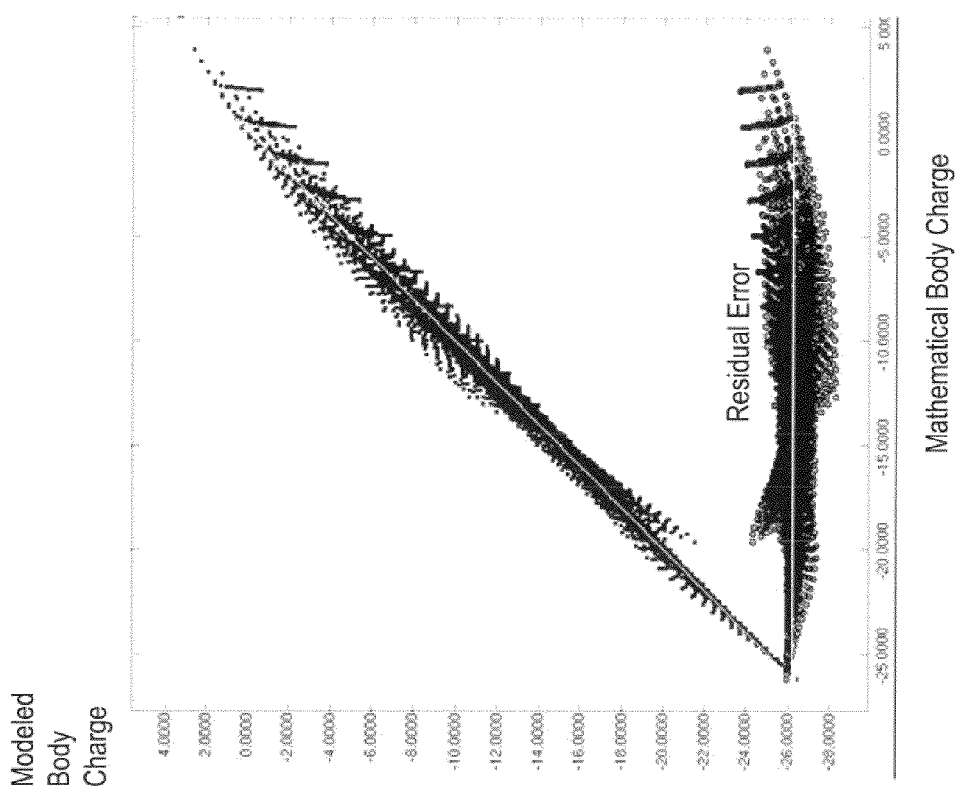
Figure 5C:
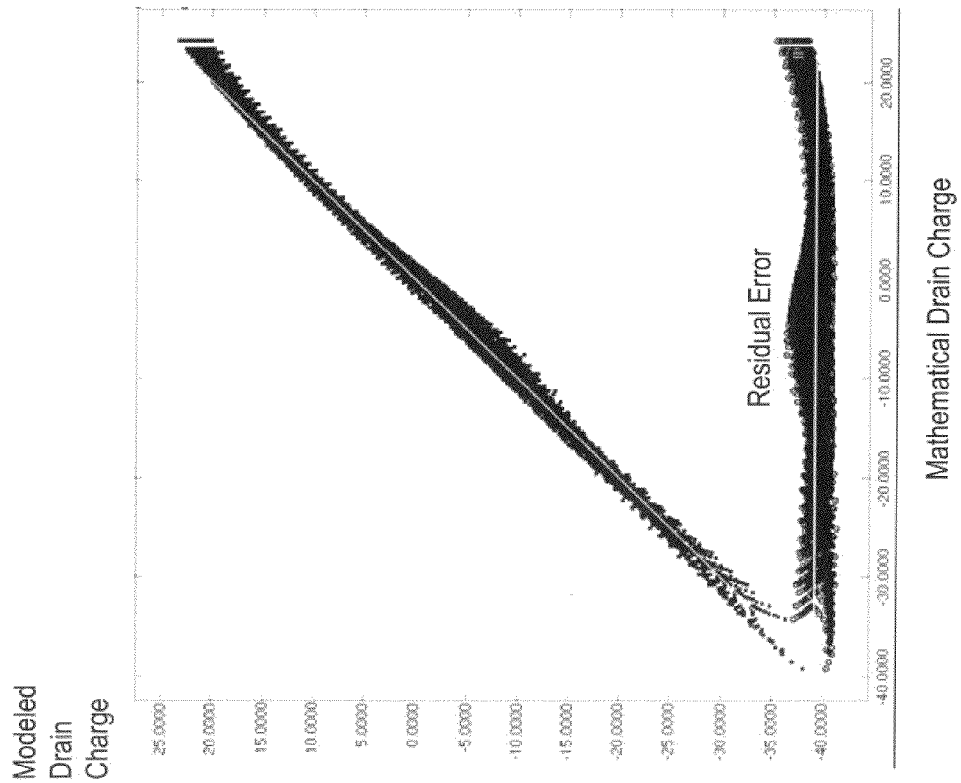

Referring now to FIG. 2, there is depicted a high level logical flowchart of an exemplary process for generating a time domain simulation model 122 of a device in an IC from empirical test data in accordance with one embodiment. As with the other logical flowcharts set forth herein, FIG. 2 indicates a logical rather than strictly chronological relationship between steps, and the indicated steps can in some cases be performed concurrently or in a different order than that shown.

The illustrated process begins at block 200 and then proceeds to block 202, which illustrates measurement tool 116 of FIG. 1 obtaining empirical data set 118 from DUT 106. To obtain empirical data set 118, measurement tool 116 directs test fixture 104 to stimulate DUT 106 with various currents and voltages and to capture measurements for the terminals (e.g., gate, source, drain and body) of each test transistor (e.g., MOSFET 108). Measurement tool 116 stores the data obtained from DUT 106 in data storage 112 as empirical data set 118, which in an exemplary embodiment can include a table for each test transistor 108.

FIG. 3 depicts an exemplary table 300 of a test transistor within data set 118. Exemplary table 300 preferably contains a large number of entries, which each contain the measured gate-source voltage (Vgs), drain-source voltage (Vds), and body-source voltage (Vbs) corresponding to the measured current at each terminal (i.e., Is, Ig, Id and Ib) of the test transistor. Preferably, the entries of table 300 include a representative sampling of data points from the sub-threshold region (Vgs<Vt), linear region, and the saturation region of operation of the test transistor. It should be noted that the charge at the transistor terminals (Qs, Qg, Qd and Qb) is preferably not measured directly from DUT 106, but is instead subsequently derived in the process of FIG. 2 and is accordingly omitted from exemplary table 300 of empirical data set 118.

Referring again to FIG. 2, block 204 depicts modeling tool 120 of FIG. 1 accessing and/or receiving an existing mathematical simulation model of a transistor. The existing mathematical simulation model, which can be a BSIM (Berkeley Short-channel IGFET Model), PSP (Penn State-Philips) model, one of the other standardized models supported by the Compact Model Council, or a proprietary transistor simulation model, generally utilizes mathematical formulae to express the drain current and drain charge as functions of the applied terminal voltages on the device. In other words, the assumption in existing mathematical simulation models is that the terminal voltages are the inputs and the terminal currents (I) and charge (Q) are outputs obtained by the application of appropriate complex functions and to the input terminal voltages and the myriad of model parameters. For ease of reference, these functions can be generally stated as:

$$I = f1(V)$$

$$Q = f2(V),$$

where f1 and f2 are mathematical functions defined by the simulation model.

Next, at block 206, modeling tool 120 samples a large number of combinations of terminal voltages and calls functions f1 and f2 of the existing mathematical simulation model to determine the corresponding simulated terminal currents (I) and charges (Q). By doing so, modeling tool 120 generates an intermediate data set 122 comprising a table 400 for each test transistor 108 as shown in FIG. 4A. Modeling tool 120 then processes empirical data set 118 and intermediate data set 122 in accordance with a selected model generation technique to obtain a table-based time domain simulation model 124 for a test transistor that expresses terminal charge Q as a function of V and I (block 208). In an exemplary embodiment, table-based time domain simulation model 124 includes a table 402 as shown in FIG. 4B for each test transistor. As indicated, each table 402 expresses terminal charge (i.e., Qs, Qg, Qd, and Qb) as and output, given the voltages and currents of the terminals.

In an exemplary embodiment, modeling tool 120 obtains table-based time domain simulation model 124 by filling in the voltages and currents of each entry of each table 402 in table-based time domain simulation model 124 directly from empirical data set 118. Modeling tool 120 additionally determines the corresponding terminal charges (i.e., Qs, Qg, Qd, and Qb) by applying a modeling technique, such as polynomial regression, to intermediate data set 122. For example, if linear regression (a form of polynomial regression that relies on first order polynomials) is applied, a linear regression model of charge Q as a function of current I and voltage V can be given as:

$$Q = \text{constant} + \text{coef}I * I + \text{coef}V * V$$

where the constant and the coefficients coefI and coefV are the parameters of the linear model. Of course, a second order (quadratic), third order (cubic) or other order of regression modeling could alternatively be utilized.

Once table-based time domain simulation model 124 has been constructed, modeling tool 120 stores table-based time domain simulation model 124 in a computer-readable storage medium, such as storage medium 112. Thereafter, the process depicted in FIG. 2 ends at block 212.

Thus, a table-based time domain simulation model 124 of a transistor is constructed utilizing empirical voltage and current data measured from test devices, as well as approximations of the charge predicted by an existing model. In this manner, the multiple month delay concomitant with traditionally modeling techniques can be avoided. Simulating based upon empirical data obtained from a test transistor having the same physical characteristics as the functional transistors of a commercial integrated circuit ensures accurate prediction of the time-domain (charging and discharging) behavior of the functional transistors of the commercial integrated circuit.

The "goodness of fit" achieved by table-based time domain simulation model 124 can be confirmed by plotting the charge at the four terminals of a test transistor (e.g., source, gate, drain, and body), as shown in FIGS. 5A-5D, respectively. In each of FIGS. 5A-5D, the charge predicted by the existing mathematical simulation model is plotted along the X axis, and the charge predicted by table-based time domain simulation model 124 is plotted along the Y axis. The residual error (i.e., the error term of the polynomial regression) is plotted along the X axis. As indicated by the cloud of points closely tracking a line having a slope of 1, the terminal charges predicted by the two models closely correspond and the approximate modeling obtained from table-based time domain simulation model 124 provides a good fit. The robustness of table-based time domain simulation model 124 has further been experimentally confirmed for various channel lengths of a test transistor. Thus, a good approximation of transistor terminal charge, which is necessary for time domain simulation of the operation of an integrated circuit under design, can be obtained directly from empirical data without the multiple month delay involved in generating a new mathematical simulation model.

Figure 6:
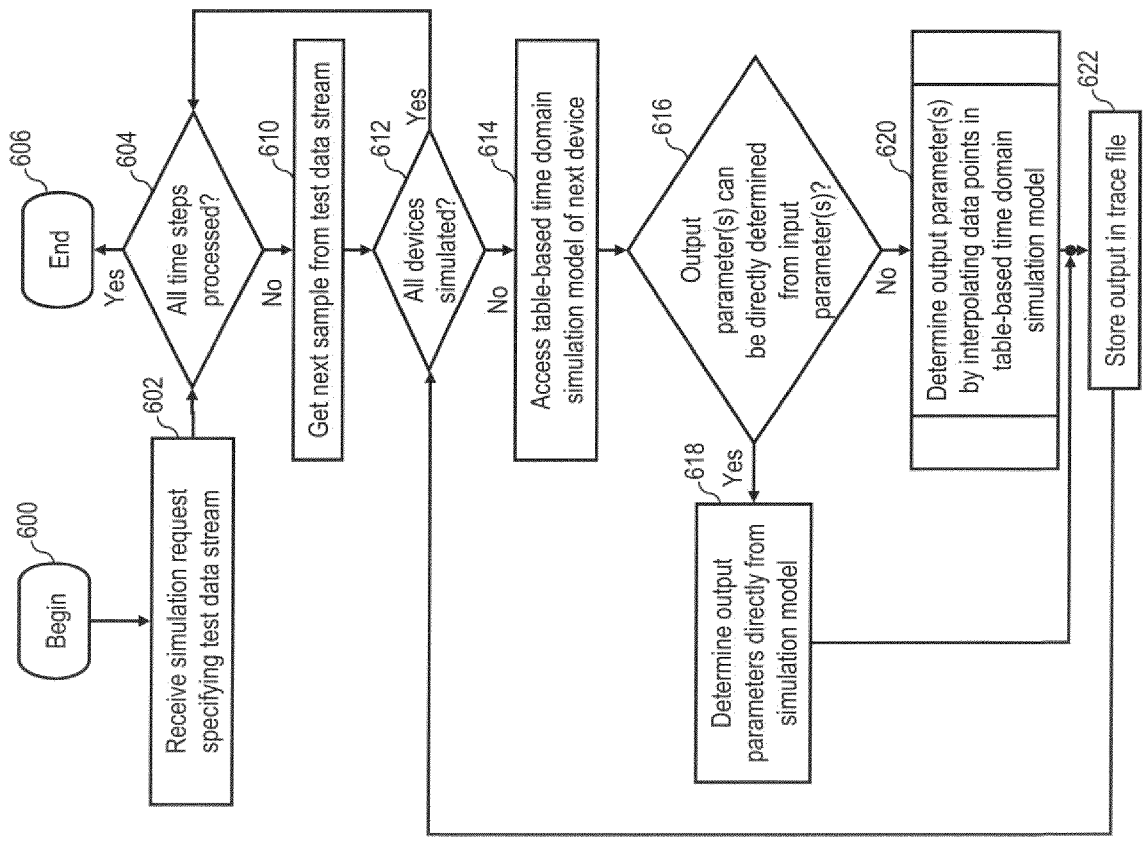
FIG. 6 is a high level logical flowchart of an exemplary method of simulating the operation of an integrated circuit in accordance with one embodiment.

Referring now to FIG. 6, there is depicted a high level logical flowchart of an exemplary method by which simulation tool 130 of FIG. 1 performs time domain simulation of the operation of an integrated circuit design in accordance with one embodiment. The depicted process begins at block 600 and then proceeds to block 602, which depicts simulation tool 130 receiving (e.g., from a client or peer device 150) a simulation request requesting simulation of an integrated circuit design including one or more devices represented by one or more time-based simulation models 124. The simulation request can include or specify a netlist of the integrated circuit design and a test data stream to be applied to the integrated circuit design. The test data stream includes a plurality of input data samples to be applied to the integrated circuit in a corresponding plurality of time steps.

Following block 602, the process proceeds to block 604, which depicts simulation tool 130 determining whether each of the time steps in the test data stream has been processed. If so, simulation tool 130 has completed simulation of the integrated circuit design, and the process terminates at block 606. If, however, simulation tool 130 determines at block 604 that not all time steps of the test data stream have been processed, the process proceeds from block 604 to block 610. Block 610 depicts simulation tool 130 obtaining the next input data sample from the test data stream. The process then enters a processing loop comprising blocks 612-622 in which each device in the integrated circuit design is simulated for the current time step. Thus, if a determination is made at block 612 that the operation of all devices in the integrated circuit design has been simulated for the current time step, the process returns to block 604, which has been described. If, however, a determination is made at block 612 that the operation of all devices in the integrated circuit design have not yet been simulated for the current time step, the process proceeds to block 614.

Block 614 depicts simulation tool 130 accessing data storage medium 112 to obtain the simulation model (e.g., table-based time domain simulation model 124) of the next device in the integrated circuit design whose operation is to be simulated. Simulation tool 130 then determines at block 616 whether or not output parameter(s) (e.g., MOSFET terminal charges) for the current device to be simulated can be directly determined from the input parameters (e.g., terminal voltages and current) for the current device by reference to the corresponding simulation model (e.g., table-based time domain simulation model 124). In the case of table-based time domain simulation model 124, the determination depicted at block 616 entails determining whether the input parameters, which are given by the test data stream or an output parameter of a previously processed device in the integrated circuit design, are specified within an entry of a table 402 of table-based time domain simulation model 124. If so, the process proceeds from block 616 to block 618, which depicts simulation tool 130 determining the output parameters of the current device for the current time step directly from the simulation model. Simulation tool 130 then stores the output parameters of the current device for the current time step in a trace file 132.

Returning to block 616, if simulation tool 130 determines that the output parameter(s) of the current device to be simulated cannot be directly determined from the input parameters by reference to the corresponding simulation model (e.g., because table-based time domain simulation model 124 contains a finite number of discrete data points), the process passes from block 616 to block 620. Block 620 depicts simulation tool 130 determining the output parameters of the current device to be simulated from simulation model 124 utilizing interpolation. Thereafter, the process passes to block 622 and following blocks, which have been described.

Figure 7:
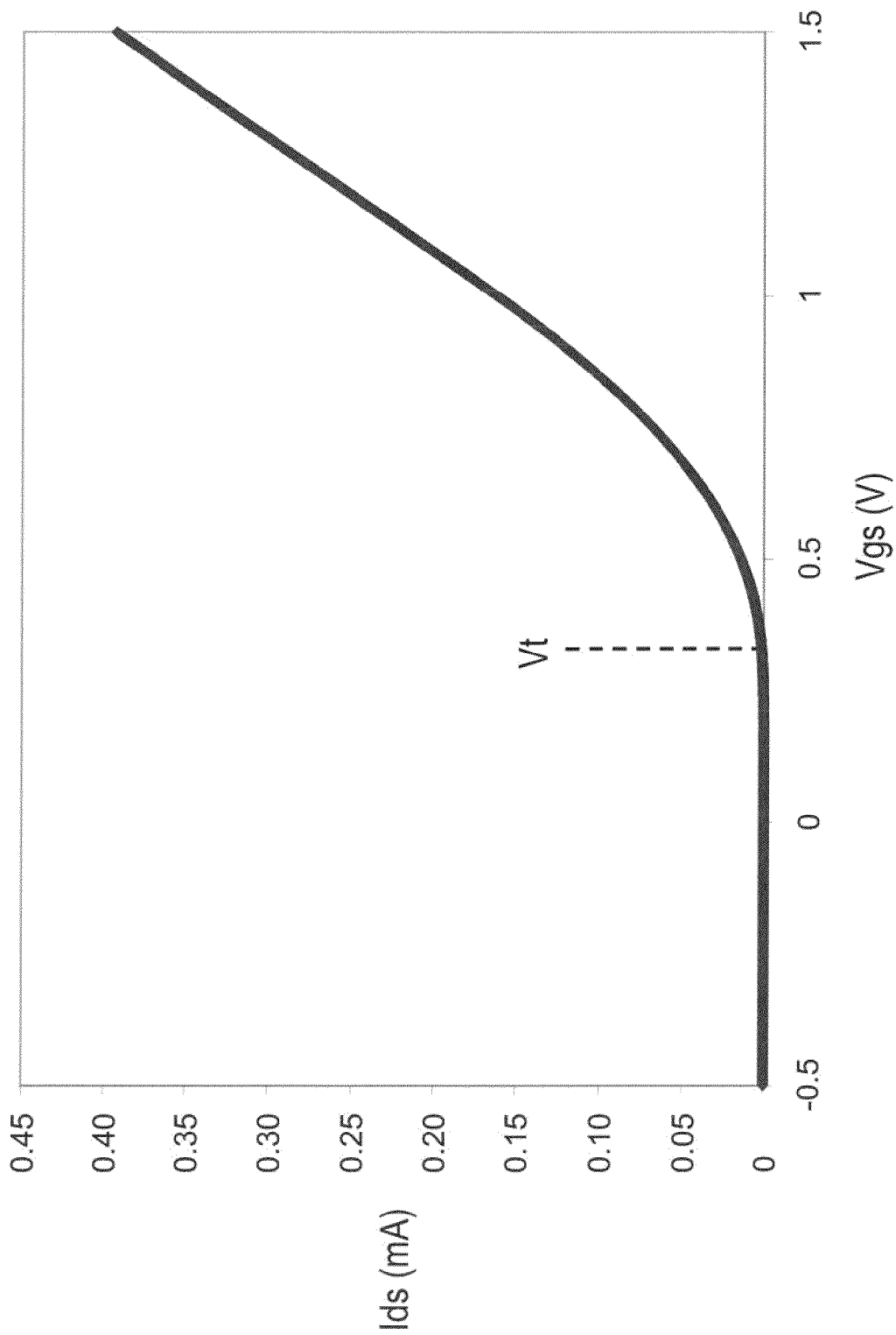
FIG. 7 is a graph of the drain-source current of a MOSFET versus the gate-source voltage.

In many approximation environments, linear interpolation is utilized to determine an approximate value when other statistically proximate values are known. However, simple linear interpolation provides poor approximations of the behavior of non-linear devices, such as transistors. This is because, as shown in FIG. 7, transistor current varies quadratically if Vgs>Vt (i.e., $I \sim V^2$) and exponentially if Vgs<Vt (i.e., $I \sim e^V$). Consequently, linear interpolation provides an adequate interpolation if Vgs>Vt, but not if Vgs<Vt. Accurate simulation of the operation of a device with Vgs<Vt is particularly important for low-power integrated circuits (e.g., Static Random Access Memory (SRAM)), which require an accurate sub-Vt model of Ids.

Figure 8:
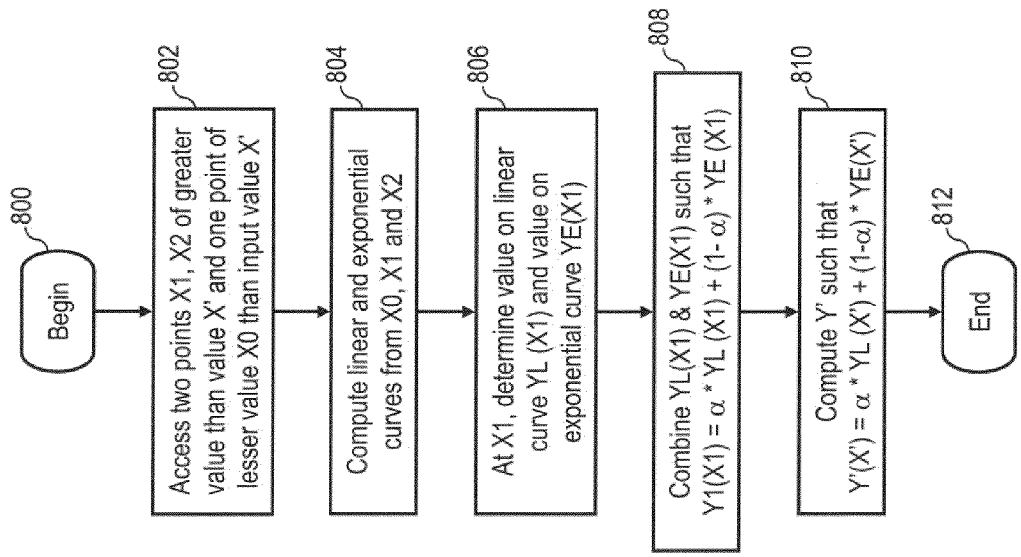
FIG. 8 is a high level logical flowchart of a method of interpolating between entries in a table-based simulation model in accordance with one embodiment.

With reference now to FIG. 8, there is illustrated a high level logical flowchart of an exemplary method of interpolating between entries in a table-based simulation model in accordance with one embodiment. The method can be implemented, for example, by simulation tool 130 at block 620 of FIG. 6, as is assumed in the following description. The method of interpolation is further illustrated and described with reference to a Cartesian coordinate graph in FIG. 9.

Figure 9:
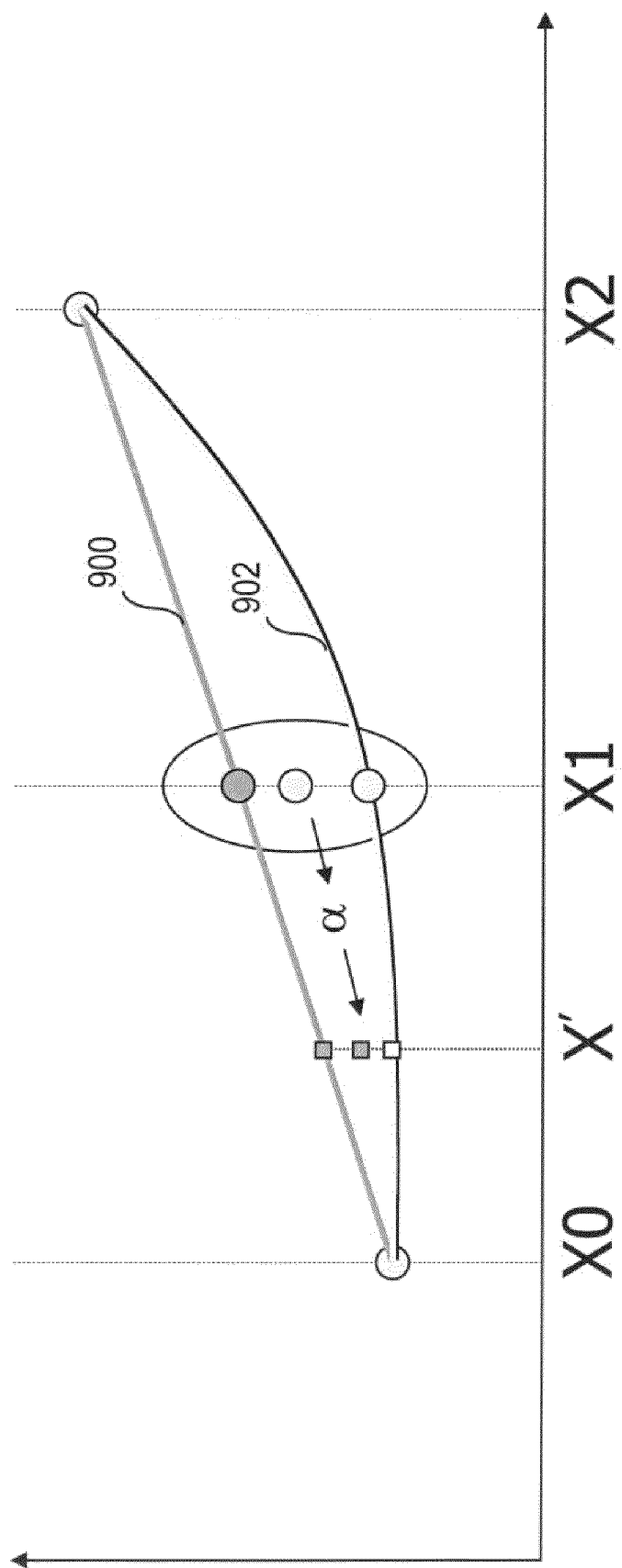
FIG. 9 is a graph illustrating the method of interpolation shown in FIG. 8.

The process shown in FIG. 8 begins at block 800 and then proceeds to block 802, which depicts simulation tool 130 accessing two data points in a table 402 of time domain simulation model 124 that are greater in value than the input value (e.g., an input terminal voltage of a MOSFET) and one data point in table 402 that is of lesser value. In FIG. 9, the input value is identified as X', the two greater values found in table 402 are identified as X1 and X2, and the one lesser value found in table 402 is identified as X0. Although not required, it is preferred if X0, X1 and X2 are the data points in table 402 closest to X'. Simulation tool 130 next computes at block 804 the linear curve 900 and exponential curve 902 fitting all of data points X0, X1 and X2.

At middle data point X1, which table 402 associates with a corresponding output value Y1, simulation tool 130 then determines the value YL(X1) on linear curve 900 and the value YE(X1) on exponential curve 902 (block 806). As indicated at block 808, simulation tool 130 mathematically combines the values YL(X1) and YE(X1) to determine a weighting parameter $\alpha$ for each of the linear and exponential models according to the equation:

$$Y1(X1)=\alpha*YL(X1)+(1-\alpha)*YE(X1).$$

Finally, at block 810, simulation tool 130 utilizes the weighting parameter $\alpha$ determined at block 808 to determine the interpolated output value Y'(X') (e.g., the charge at a MOSFET terminal) according to the equation:

$$Y'(X')=\alpha*YL(X')+(1-\alpha)*YE(X').$$

Thus, the interpolated value is determined utilizing the weighted sum of a linear interpolation and an exponential interpolation, with the weighting determined at a known data point. Following block 810, the interpolation process depicted in FIG. 8 terminates at block 812.

Figure 10A:
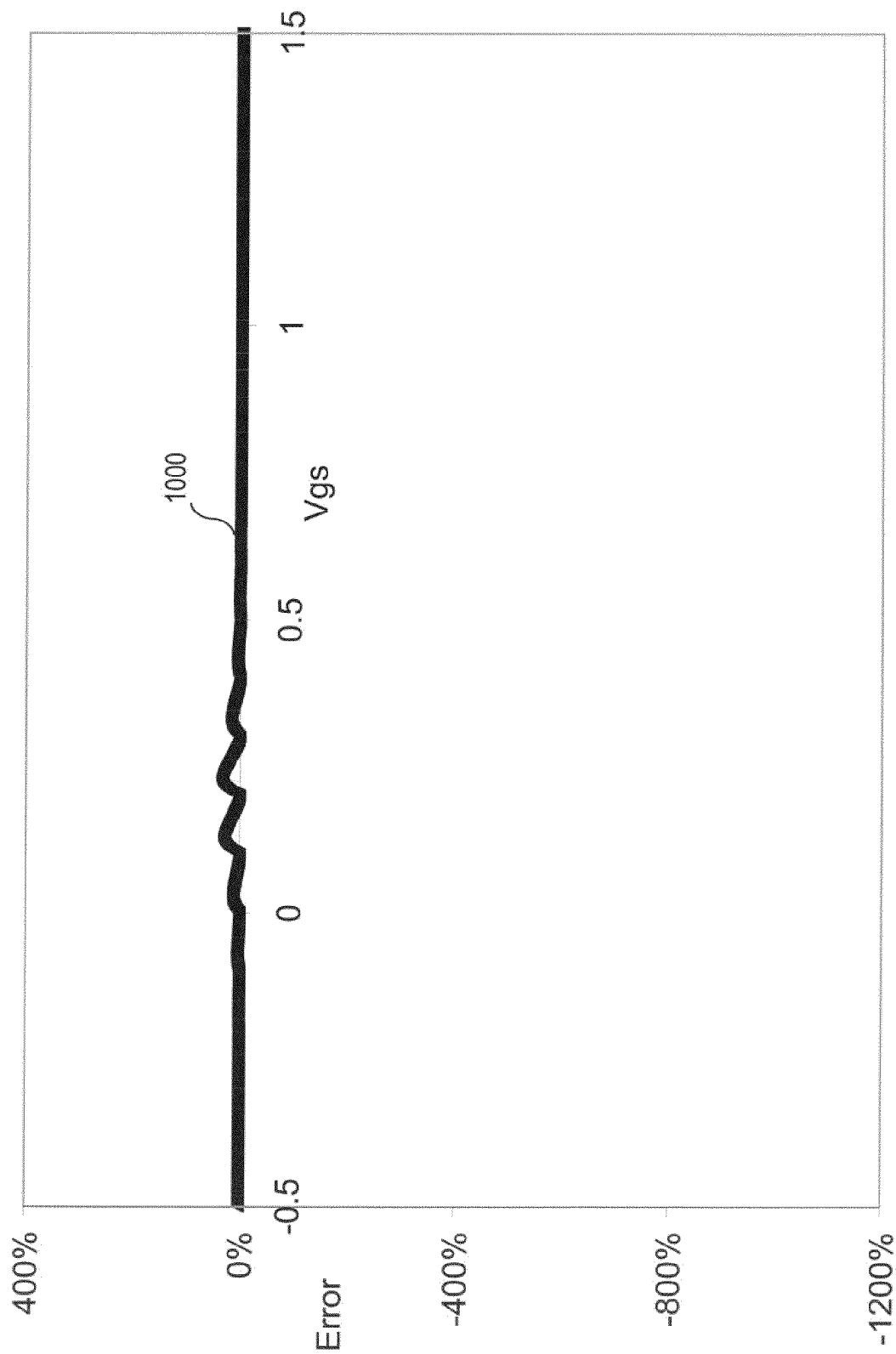
FIGS. 10A-10B are graphs illustrating the reduction in error achieved by the method of interpolation shown in FIG. 8.
Figure 10B:
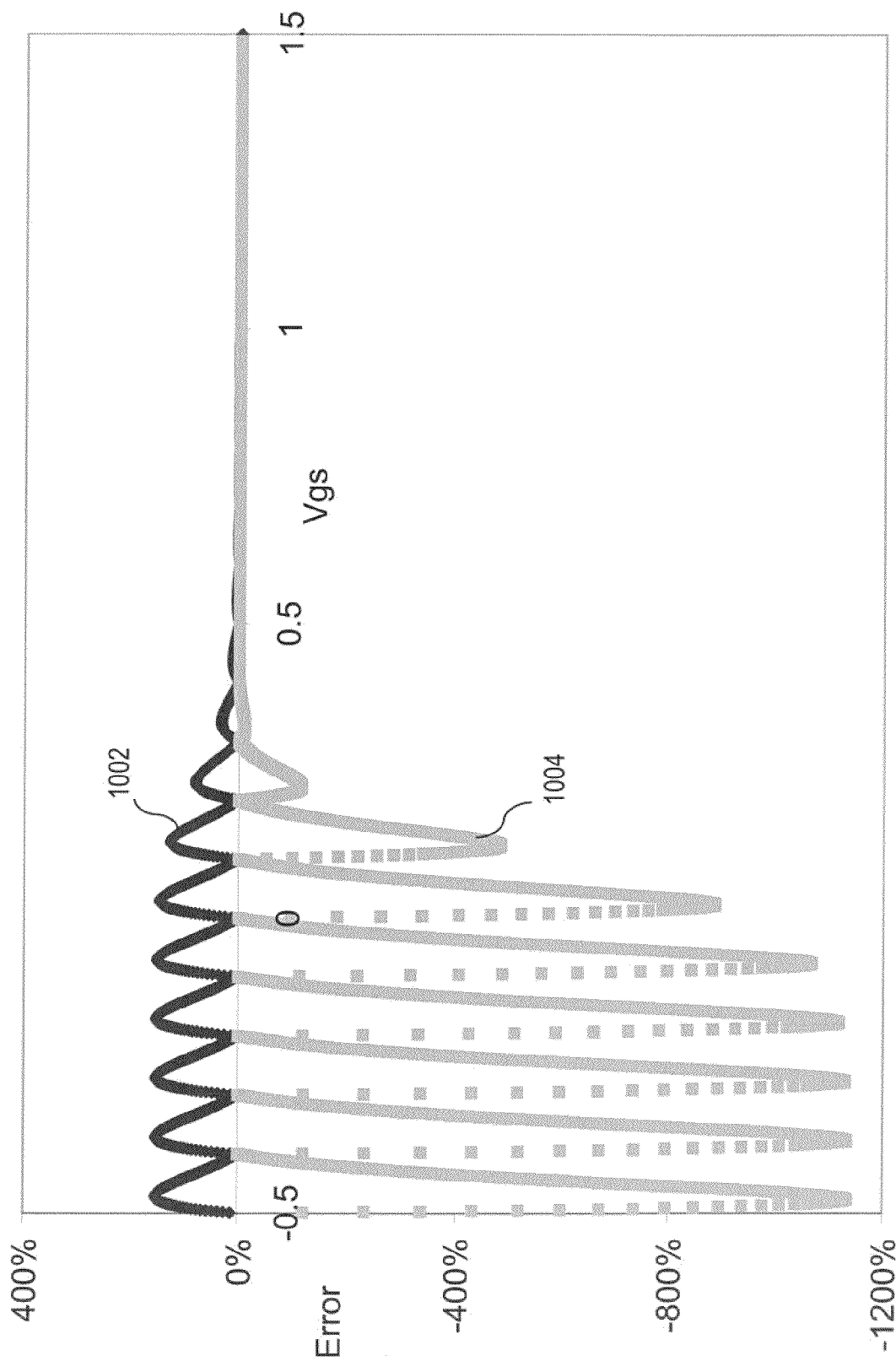

Referring now to FIGS. 10A-10B, there are depicted graphs of the experimental error obtained by utilizing the mixed interpolation process shown in FIGS. 8-9 in comparison with conventional linear and exponential interpolation. In FIGS. 10A-10B, the gate-source voltage Vgs of a MOSFET is shown along the X axis, and the percentage error of the gate charge predicted by interpolation is shown along the Y axis. As can be seen by comparison of mixed interpolation error curve 1000 of FIG. 10A and linear interpolation error curve 1002 and exponential error curve 1004 of FIG. 10B, the error associated with the mixed interpolation process of FIGS. 8-9 is significantly better than that obtained by using conventional linear or exponential interpolation alone.

One challenge of simulating IC operation utilizing a table-based time domain simulation model is how to handle variations between the characteristics of a device to be simulated and the fabricated devices from which the empirical data utilized to construct the tables were measured. For example, the small MOSFETs typically used in SRAM to achieve high device densities may have a significantly different threshold gate-source voltage (Vt) than that of the test MOSFETs 108 utilized to construct table-based time domain simulation model 124. Table-based time domain simulation model 124 can nevertheless be utilized to simulate operation of a device having different characteristics than the test device, as described further below.

Figure 11:
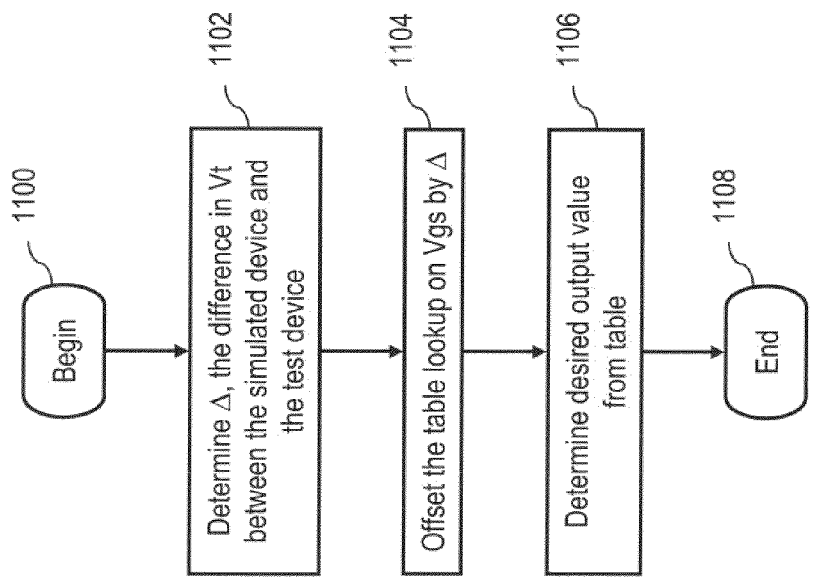
FIG. 11 is a high level logical flowchart of an exemplary method by which a table-based time domain simulation model may be utilized to simulate operation of a simulated transistor having a different threshold voltage than a test transistor from which the empirical data utilized to construct the table-based time domain simulation model was collected.

With reference now to FIG. 11, there is illustrated a high level logical flowchart of an exemplary method by which a table-based time domain simulation model may be utilized to simulate operation of a simulated transistor having a different threshold voltage than a test transistor from which the empirical data utilized to construct the table-based time domain simulation model was collected. The illustrated process can be performed, for example, at each of blocks 616 and 618 of the simulation process depicted in FIG. 6.

The process depicted in FIG. 11 begins at block 1100 with a given input value set for which a simulated output value is desired. For example, for table 402 of FIG. 4B, the input value set would be (Vds, Vgs, Vbs) and the simulated output value to be determined may be Igs. Thus, the function of the table can be expressed as follows;

$$Igs=TABLE(Vds,Vgs,Vbs).$$

The process proceeds from block 1100 to block 1102, which illustrates simulation tool 130 determining $\Delta$, which is the difference in the threshold gate-source voltage between the simulated transistor and the test transistor from which the table-based time domain simulation model 124 was derived. Assuming a table 402 formatted as depicted in FIG. 4B in which the desired output value (e.g., Igs) is a function of Vds, Vgs, and Vbs, the desired output value can be obtained in table 402 for the given set of input voltages Vds, Vgs, and Vbs by offsetting the lookup of the specified input voltage Vgs by $\Delta$ (block 1104). That is:

$$Igs=TABLE(Vds,Vgs+\Delta,Vbs).$$

Simulation tool 130 can thereafter provide the desired simulated output value (e.g., Igs) directly from table 402, as described with reference to block 618, or can alternatively determine the simulated output value utilizing interpolation, as described with reference to block 620 and FIGS. 8-9. Thereafter, the process depicted in FIG. 11 terminates at block 1106.

Figure 12A:
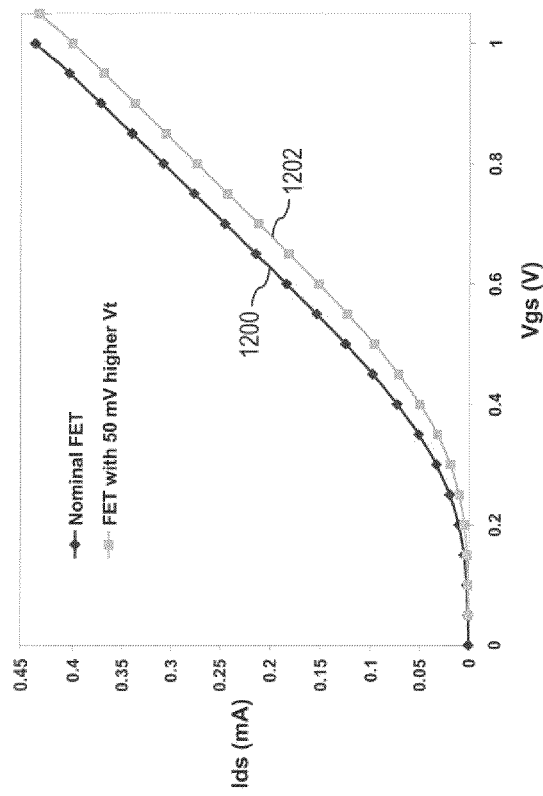
FIGS. 12A-12B graphically illustrate the application of the process depicted in FIG. 11 to the simulation of the current in a MOSFET having a 50 mV higher threshold voltage than a nominal test MOSFET whose empirical measurements were utilized to construct a table-based time domain simulation model.
Figure 12B:
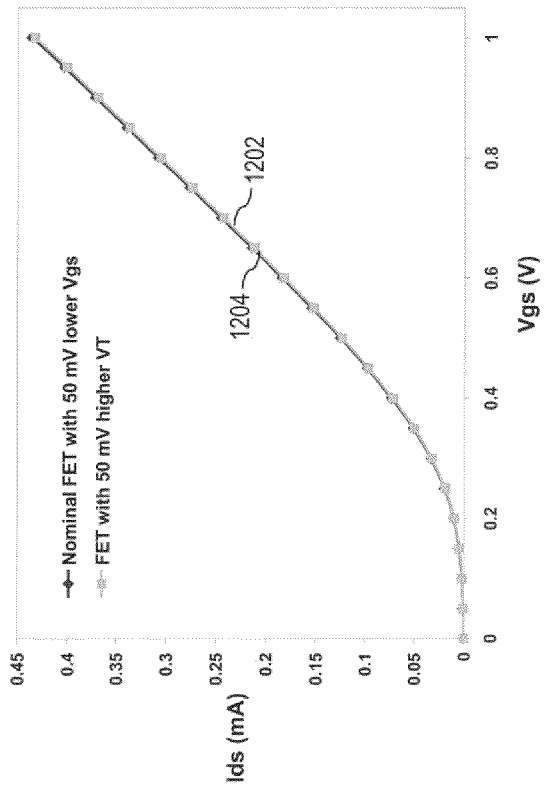

FIGS. 12A-12B graphically illustrate the application of the process depicted in FIG. 11 to the simulation of a MOSFET having a 50 mV higher threshold voltage Vt than a nominal test MOSFET whose empirical measurements were utilized to construct a table-based time domain simulation model. In particular, FIG. 12A depicts a first curve 1200 representing a plot of the gate-source voltage (Vgs) versus the drain-source current (Ids) of the nominal MOSFET as well as a second curve 1202 formed by plotting Vgs versus Igs for the simulated MOSFET. Although the curves 1200 and 1202 are similar, they do not align given the difference in threshold voltages between the nominal MOSFET and the simulated MOSFET.

If, however, the Vgs lookup in table 402 of table-based time domain simulation model 124 is offset by the 50 mV difference in threshold voltages as depicted in FIG. 12B, second curve 1202 of the simulated MOSFET matches very closely with a third curve 1204 generated from the data obtained from table 402.

Figure 13A:
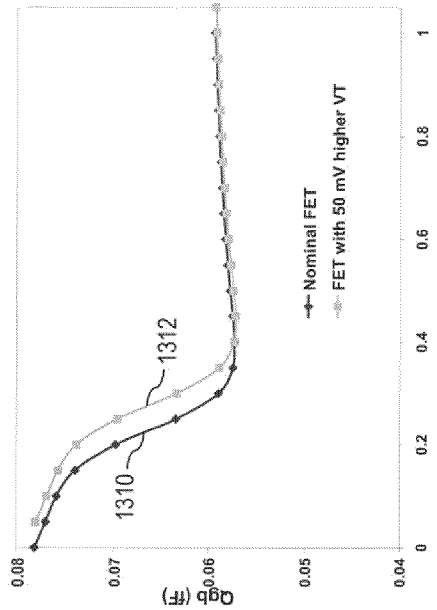
FIGS. 13A-13D graphically illustrate the application of the process depicted in FIG. 11 to the simulation of the charge on the terminals of a MOSFET having a 50 mV higher threshold voltage than a nominal test MOSFET whose empirical measurements were utilized to construct a table-based time domain simulation model.

The table offset technique depicted in FIG. 11 is not limited in application to simulation of transistor current, as demonstrated by FIGS. 13A-13D, which illustrate that the same table offset technique can be utilized to accurately approximate transistor terminal charge. In particular, FIG. 13A depicts a first curve 1300 representing a plot of the gate-source voltage (Vgs) versus the gate-source charge (Qgs) of the nominal MOSFET as well as a second curve 1302 formed by plotting Vgs versus Qgs for the simulated MOSFET. As noted above, curves 1300 and 1302, although similar, do not align given the difference in threshold voltages between the nominal MOSFET and the simulated MOSFET.

Figure 13C:
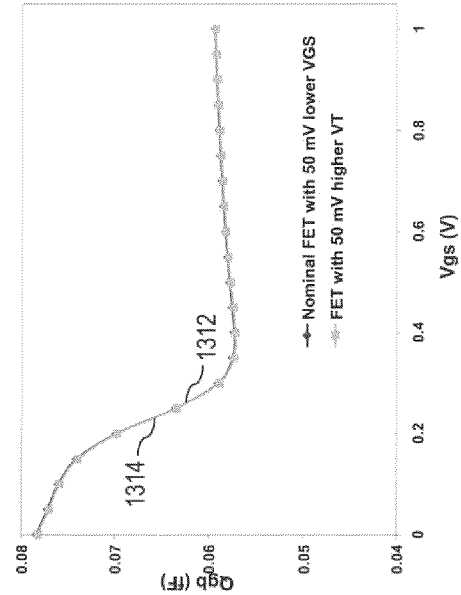
Figure 13B:
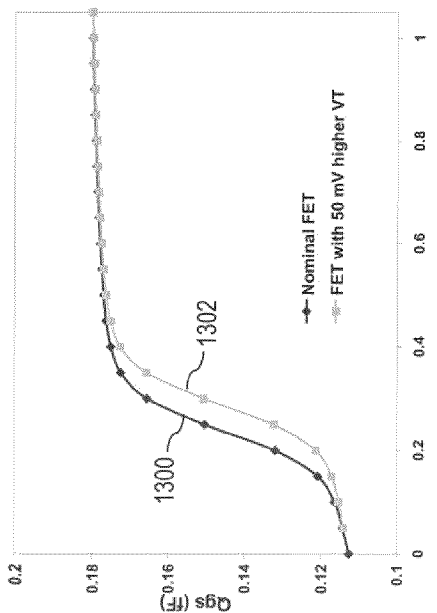

If, however, the Vgs lookup in table 402 of table-based time domain simulation model 124 is offset by the 50 mV difference in threshold voltages as depicted in FIG. 13B, second curve 1302 of the simulated MOSFET matches to a close approximation with a third curve 1304 generated from the data obtained from table 402.

Figure 13D:
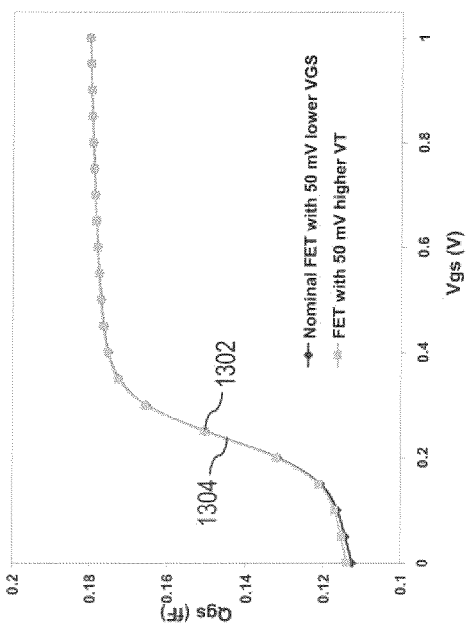

FIG. 13C similarly illustrates a first curve 1310 representing a plot of the gate-source voltage (Vgs) versus the gate-base charge (Qgb) of the nominal MOSFET as well as a second curve 1312 formed by plotting Vgs versus Qgb for the simulated MOSFET. Again, curves 1310 and 1312, although similar, do not align given the difference in threshold voltages between the nominal MOSFET and the simulated MOSFET. If the Vgs lookup in table 402 of table-based time domain simulation model 124 is offset by the 50 mV difference in threshold voltages as depicted in FIG. 13D, second curve 1312 of the simulated MOSFET matches to a close approximation with a third curve 1314 generated from the data obtained from table 402.

As has been described, in at least one embodiment, empirical measurements, such as an empirical node current and an empirical node voltage at each of a plurality of terminals, are gathered from a fabricated integrated circuit transistor. An input simulation model of a simulated transistor is utilized to generate a simulation data set by determining, for each of a plurality of different empirical terminal voltages, a simulated terminal current and a simulated terminal charge. A modeling tool then processes the simulation data set and empirical data set to obtain a time domain simulation model of the fabricated transistor that, for a given input terminal voltage and input terminal current, provides a simulated terminal charge for the plurality of terminals. The time domain simulation model is then stored in a computer-readable data storage medium for subsequent simulation of an integrated circuit design including at least one transistor.

In the simulation of the integrated circuit design, a simulation tool approximates desired values that cannot be obtained directly from the time domain simulation model by interpolation. It is preferred if the simulation tool performs a "mixed" interpolation in which a desired value is determined by combining values proposed by linear and exponential interpolation models in accordance with a mixing parameter determined at a proximate data point specified by the time domain simulation model.

The time domain simulation model is robust in that it can be used to simulate devices having different characteristics. For example, the simulation tool compensates for variation in the threshold voltage of a transistor by offsetting the table lookup of the gate-source voltage by the amount of variation of the threshold voltage of the simulated transistor from a nominal test transistor from which the time domain simulation model was built. By offsetting the table lookup in this manner, terminal currents and charges can be accurately approximated.

While one or more embodiments have been particularly shown and described, it will be understood by those skilled in the art that various changes in form and detail may be made therein without departing from the spirit and scope of the invention. For example, although various aspects and embodiments have been described with respect to a computer system executing program code that directs certain functions, it should be understood that the present invention may be implemented as a program product for use with a data processing system. Program code defining the functions of the present invention can be delivered to a data processing system via a variety of computer-readable storage media, which include, without limitation, non-rewritable storage media (e.g., CD-ROM) and rewritable storage media (e.g., a flash memory or hard disk drive).

What is claimed is:

1. A method of data processing in a data processing system, the method comprising:
   accessing, by a processor in the data processing system, a transistor operation data structure to determine a set of known data points surrounding a queried transistor operation data point for a queried transistor having an input value, where the transistor operation data structure is a table-based time domain structure that expresses output values of transistors as a function of a set of input values to the transistors, wherein the set of known data points includes first, second and third data points, and wherein the first, second and third data points are identified based on the input value for the queried transistor;
   building, by the processor, a first curve from the first, second and third data points utilizing a linear model and building a second curve from the first, second and third data points utilizing an exponential model;
   determining, by the processor, a weighting parameter value by which the first curve and second curve are blended at the second data point according to a first equation:

$$Y1(X1)=\alpha^* YL(X1)+(1-\alpha)^* YE(X1)$$

wherein X1 is an input value associated with the second data point, wherein Y1(X1) is an output value associated with the second data point, wherein YL(X1) is an output value at the second data point on the first curve, wherein YE(X1) is an output value at the second data point on the second curve, and wherein $\alpha$ is the weighting parameter value; and
   determining and storing, by the processor, an output value of the queried transistor operation data point as transformed by blending the first curve and the second curve utilizing the input value of the queried transistor operation data point and the weighting parameter value according to a second equation:

$$Y'(X')=\alpha^* YL(X')+(1-\alpha)^* YE(X')$$

wherein X' is the input value of the queried transistor operation data point, wherein Y'(X') is the output value of transistor operation data point, wherein YL(X') is an output value at the queried transistor operation data point on the first curve, wherein YE(X') is an output value at the queried transistor operation data point on the second curve, and wherein $\alpha$ is the weighting parameter value; and
   utilizing, by the processor, the output value of the queried transistor operation data point as a model for the queried transistor in a simulation of an integrated circuit device.

2. The method of claim 1, wherein:
   the first data point has a value less than the input value of the queried transistor operation data point; and
   the second and third data points have values greater than the input value of the queried transistor operation data point, wherein the third data point is greater than the second data point.

3. The method of claim 1, wherein:
   the transistor operation data structure contains a plurality of data points modeling a behavior of a simulated integrated circuit device; and
   the queried transistor operation data point represents the behavior of the simulated integrated circuit device under a condition indicated by the input value.

4. The method of claim 3, and further comprising:
   populating, by the processor, the transistor operation data structure utilizing empirical data measured from a fabricated integrated circuit device and modeled data based on the simulated integrated circuit device.

5. The method of claim 4, wherein the accessing includes offsetting an access to the transistor operation data structure to compensate for a variation between a characteristic of the simulated integrated circuit device and the fabricated integrated circuit device.

6. A program product, comprising:
a computer-readable storage medium; and
program code within the computer-readable storage medium that, when processed by a data processing system, causes the data processing system to:
access a transistor operation data structure to determine a set of known data points surrounding a queried transistor operation data point for a queried transistor having an input value, wherein the transistor operation data structure is a table-based time domain structure that expresses output values of transistors as a function of a set of input values to the transistors wherein the set of known data points includes first, second and third data points, and wherein the first, second and third data points are identified based on the input value for the queried transistor;
build a first curve from the first, second and third data points utilizing a linear model and building a second curve from the first, second and third data points utilizing an exponential model;
determine a weighting parameter value by which the first curve and second curve are blended at the second data point according to a first equation:

$$Y1(X1)=\alpha*YL(X1)+(1-\alpha)*YE(X1)$$

wherein X1 is an input value associated with the second data point, wherein Y1(X1) is an output value associated with the second data point, wherein YL(X1) is an output value at the second data point on the first curve, wherein YE(X1) is an output value at the second data point on the second curve, and wherein $\alpha$ is the weighting parameter value; and
determine and store an output value of the queried transistor operation data point as transformed by blending the first curve and the second curve utilizing the input value of the queried transistor operation data point and the weighting parameter value according to a second equation:

$$Y'(X')=\alpha*YL(X')+(1-\alpha)*YE(X')$$

wherein X' is the input value of the queried transistor operation data point, wherein Y'(X') is the output value of the queried transistor operation data point, wherein YL(X') is an output value at the queried transistor operation data point on the first curve, wherein YE(X') an output value at the queried transistor operation data point on the second curve, and wherein $\alpha$ is the weighting parameter value; and
utilize the output value of the queried transistor operation data point as a model for the queried transistor in a simulation of an integrated circuit device.

7. The program product of claim 6, wherein:
the first data point has a value less than the input value of the queried transistor operation data point; and
the second and third data points have values greater than the input value of the transistor operation queried transistor operation data point, wherein the third data point is greater than the second data point.

8. The program product of claim 6, wherein:
the transistor operation data structure contains a plurality of data points modeling a behavior of a simulated integrated circuit device; and
the queried transistor operation data point represents the behavior of the simulated integrated circuit device under a condition indicated by the input value.

9. The program product of claim 8, wherein the program code further causes the data processing system to populate the transistor operation data structure utilizing empirical data measured from a fabricated integrated circuit device and modeled data based on the simulated integrated circuit device.

10. The program product of claim 9, wherein program code further causes the data processing system to offset access to the transistor operation data structure to compensate for a variation between a characteristic of the simulated integrated circuit device and the fabricated integrated circuit device.

11. A data processing system, comprising:
a processor;
at least one computer-readable storage medium coupled to the processor; and
program code within the at least one computer-readable storage medium that, when processed by the processor, causes the data processing system to:
access a transistor operation data structure to determine a set of known data points surrounding a queried transistor operation data point for a queried transistor having an input value, wherein the transistor operation data structure is a table-based time domain structure that expresses output values of transistors as a function of a set of input values to the transistors, wherein the set of known data points includes first, second and third data points, and wherein the first second and third data points are identified based on the input value for the queried transistor;
build a first curve from the first, second and third data points utilizing a linear model and building a second curve from the first, second and third data points utilizing an exponential model;
determine a weighting parameter value by which the first curve and second curve are blended at the second data point according to a first equation:

$$Y1(X1)=\alpha*YL(X1)+(1-\alpha)*YE(X1)$$

wherein X1 is an input value associated with the second data point, wherein Y1(X1) is an output value associated with the second data point, wherein YL(X1) is an output value at the second data point on the first curve, wherein YE(X1) is an output value at the second data point on the second curve, and wherein $\alpha$ is the weighting parameter value; and
determine and store an output value of the queried transistor operation data point as transformed by blending the first curve and the second curve utilizing the input value of the queried transistor operation data point and the weighting parameter value according to a second equation:

$$Y'(X')=\alpha*YL(X')+(1-\alpha)*YE(X')$$

wherein X' is the input value of the queried transistor operation data point wherein Y'(X') is the output value of the queried transistor operation data point, wherein YL(X') is an output value at the queried transistor operation data point on the first curve, wherein YE(X') is an output value at the queried transistor operation data point on the second curve, and wherein $\alpha$ is the weighting parameter value; and
utilize the output value of the queried transistor operation data point as a model for the queried transistor in a simulation of an integrated circuit device.

12. The data processing system of claim 11, wherein:
the first data point has a value less than the input value of the queried transistor operation data point; and
the second and third data points have values greater than the input value of the queried transistor operation data point, wherein the third data point is greater than the second data point.

13. The data processing system of claim 11, wherein:
the transistor operation data structure contains a plurality of data points modeling a behavior of a simulated integrated circuit device; and
the queried transistor operation data point represents the behavior of the simulated integrated circuit device under a condition indicated by the input value.

14. The data processing system of claim 13, wherein the program code further causes the data processing system to populate the transistor operation data structure utilizing empirical data measured from a fabricated integrated circuit device and modeled data based on the simulated integrated circuit device.

15. The data processing system of claim 14, wherein program code further causes the data processing system to offset access to the transistor operation data structure to compensate for a variation between a characteristic of the simulated integrated circuit device and the fabricated integrated circuit device.

* * * * *